(12) United States Patent
Koenen

(10) Patent No.: US 6,349,035 B1
(45) Date of Patent: Feb. 19, 2002

(54) METHOD AND APPARATUS FOR TOOLESS MATING OF LIQUID COOLED COLD PLATE WITH TAPERED INTERPOSER HEAT SINK

(75) Inventor: David J. Koenen, Austin, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/675,282

(22) Filed: Sep. 29, 2000

(51) Int. Cl.[7] .............................................. H05K 7/20

(52) U.S. Cl. .................... 361/719; 29/890.03; 257/727; 361/700

(58) Field of Search .............................. 29/890.03, 832, 29/834, 842; 165/80.3, 80.4, 185, 104.33; 62/259.2; 174/15.2, 16.3; 257/707, 718, 719, 727; 267/150, 158, 160; 248/316.7, 505, 510; 24/295, 297, 453, 457, 458, 627; 361/687, 699, 700, 710–712, 717–719, 704, 705

(56) References Cited

U.S. PATENT DOCUMENTS

| | | | | |
|---|---|---|---|---|
| 4,298,904 A | * | 11/1981 | Koenig | 361/720 |
| 4,994,937 A | * | 2/1991 | Morrison | 361/715 |
| 5,272,599 A | | 12/1993 | Koenen | 361/710 |
| 5,886,872 A | | 3/1999 | Koenen et al. | 361/719 |
| 6,118,654 A | * | 9/2000 | Bhatia | 361/687 |

* cited by examiner

*Primary Examiner*—Gerald Tolin
(74) *Attorney, Agent, or Firm*—Conley, Rose & Tayon, P.C.; Michael F. Heim; Marcella D. Watkins

(57) ABSTRACT

A heat dissipating apparatus for use on a heat generating electric component inside a computer comprises an interposer mounted on the heat generating electric component and a heat absorbing member including a heat absorber, a bracing member, and a spring biasing said heat absorber toward the bracing member. The heat absorbing member is moveable between a first position in which the interposer is compressed between the heat absorber and the bracing member and a second position in which the interposer is not compressed between the heat absorber and the bracing member.

17 Claims, 5 Drawing Sheets

US 6,349,035 B1

METHOD AND APPARATUS FOR TOOLESS MATING OF LIQUID COOLED COLD PLATE WITH TAPERED INTERPOSER HEAT SINK

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to the cooling of heat-generating components in electronic apparatus and more particularly to the cooling of a heat-generating computer components. Still more particularly, the present invention relates to a spring-loaded heat dissipation apparatus that is particularly suited for use with heat generating components inside a computer.

2. Background of the Invention

As computer operating speeds and chip capacities keep increasing, it is becoming increasingly difficult to provide adequate cooling for processors and other high heat generating components used in electronic equipment. This is particularly true in the case of computers utilizing multiple processors and hot plug drive arrays. At the same time, as component density and power usage increase, it becomes increasingly important to remove the heat generated during operation so as to avoid overheating and ensure consistent operation of the devices.

For example, one trend in the computer industry has been to increase the number of CPUs per rack unit. Because rack space inside a computer is limited, there has been a trend toward packing more components, such as CPUs, memory, disk drives, and I/O, more and more closely together. As the components, each of which generate heat, are packed more closely together, air cooling becomes less feasible. Forced air cooling, which entails blowing air across hot components, or across a heat sink in thermal contact with the hot components, is limited to applications in which the flowing air can maintain a sufficient velocity across the hot components and thus can effectively remove heat from it. When components are packed together, it is no longer possible to achieve sufficient air velocity across the hot components.

This is particularly true when chips are disposed within multi-chip modules that generate significant amounts of heat. In addition, because there is a great demand to run these processor modules at higher speeds, the corresponding clock frequencies at which these devices must operate become higher. In this regard, it should be noted that power generation rises in proportion to the clock frequency. Accordingly, that the desire for faster computers generates not only demand for faster components, but also generates thermal demands in terms of energy that must be removed for faster, safer and more reliable circuit operation.

Until recently, extruded aluminum heat sinks have been considered sufficient for computer cooling needs. These metal heat sinks depend on air moving through the system to carry away waste heat, However, aluminum heat sinks have a number of well known disadvantages, which include the following: 1) heat sinks often obstruct access and impede processor removal; 2) the to include large heat sinks can force too wide spacing of multiple processors, causing signal propagation delay and package volume concerns; 3) the chassis design must allow sufficient air flow past the heat sink; 4) large heat sinks often obstruct air flow to other components; 5) large heat sink volumes decrease the density of a system design; 6) air heated by the processor heat sink is less effective for cooling other components in the electronic apparatus; 7) supporting the mass of a large heat sink poses mounting and vibration concerns; and 8) fans may be required to provide sufficient air flow across a heat sink.

With air cooling becoming less adequate, liquid cooling has begun to be more widely practiced for cooling computer components. In liquid cooling, sometimes also referred to as "cold plate" cooling, a liquid is pumped through a closed loop cooling system and removes heat from heat exchangers that are in thermal contact with each of the processor chips (or other high heat-generating components or assemblies). Provided sufficient heat transfer occurs between the hot components and the liquid coolant, liquid cooling is much more effective than air cooling. On the other hand, liquid cooling requires a suitable heat transfer mechanism between the hot components and the coolant, and requires plumbing to handle the liquid cooling medium in both cooled and heated states. In instances where it is desired to provide hot-add and/or hot-replace access to the components, conventional cold plate installations often require disconnection of the fluid lines from the cold plates so as to allow access to the desired component(s).

Known techniques for achieving the required degree of thermal contact between a hot component and its associated cold plate typically involve cams or screws, which can maintain a desired amount of pressure at the interface between the hot component and the cold plate. However, cams may require special linkages to force the surfaces together during installation and to release contact prior to removal. Similarly, screws and/or bolts may be difficult to access and to or remove, particularly when the hot component is buried deep within the chassis or obstructed by other devices.

An example of such a linkage structure can be found in U.S. Pat. No. 5,886,872. The linkage structure allows the heat absorbing member to shift between first and second positions in which the heat absorbing member is alternately connected and disconnected from thermal contact with the heat generating electronic component. While such a linkage structure has clear advantages in ease of use, it is still desirable to provide a means by which a heat absorbing member can be effectively and quickly attached to a heat generating component.

In view of the foregoing problems, limitations and disadvantages associated with the above-mentioned cooling systems, it can seen that a need exists for an alternative type of cooling system that eliminates or at least substantially reduces such problems, limitations and disadvantages. In particular, it is desirable to provide a mechanism for applying a desired amount of pressure at the interface between the hot component and the cold plate. It is further desirable to provide a cooling device that is easy to install, and to eliminate the need for tools and/or special linkages for achieving thermal contact.

BRIEF SUMMARY OF THE INVENTION

The present invention includes a cooling system that substantially reduces the problems, limitations and disadvantages described above. In particular, the present invention provides a mechanism for applying a desired amount of pressure at the interface between the hot component and the cold plate. The present invention further provides a cooling device that is easy to install and makes it possible to achieve and maintain the desired thermal contact without tools and/or special linkages.

In one preferred embodiment of the present invention, an electronic device such as a computer comprises a housing and a heat generating electronic component, such as a processor, disposed in the housing. To dissipate operating heat from the heat generating component, a heat dissipation apparatus is provided within the housing and comprises at least one heat absorbing member, a bracing member, and a holding structure connecting the heat absorbing member to the bracing member and supporting the heat absorbing member in a heat transfer relationship with the heat generating electronic component.

According to a feature of the invention, the holding structure is manually operable, without tools, to releasably clamp the heat absorbing member against the heat generating electronic component.

According to another feature of the invention, the heat generating electric component has at least one heat transfer surface that is provided with a tapered heat sink interposer. In one preferred embodiment, the heat generating electric component has two opposing heat transfer surfaces, each of which is provided with a tapered heat sink interposer. The heat absorbing member is provided with a corresponding pair of opposed heat absorbers supported on a spring-loaded holding device. The combination of the two tapered interposers forms a wedge-shaped body that easily slides between the two opposed heat absorbers, wedging them apart against the closing force applied by the spring-loaded holding device. In another embodiment, the heat generating electric component has only one heat transfer surface and the heat absorbing member is provided with one heat absorber, which contacts the heat transfer surface, and one bracing member, which contacts the opposite surface of the heat generating electric component.

According to another feature of the invention, at least one, and preferably both, of the heat absorbers comprises a liquid cooled cold plate. If both heat absorbers are not cold plates, the second heat absorbing member may comprise a finned metal heat sink member adapted for air cooling or some other suitable heat absorbing device.

The incorporation of the present heat dissipating apparatus in a computer allows sufficient cooling to be applied to even crowded, high-output systems and allows tool-less installation and removal access to the processor and near by equipment. The present system allows the disconnection of the heat absorbing member from thermal contact without necessitating disconnection of fluid flow lines.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, unless otherwise noted, the term "contact" or "contacts" is intended to require either indirect or direct thermal conductivity other than through air. Thus, if a first device contacts a second device, that heat can be conducted between the devices through either a direct physical contact, or through indirect physical contact via other devices and components. Similarly, references to vertical, horizontal, above, or below, refer to the illustrations in the Figures only, and are not intended to limit the invention in any way.

DETAILED DESCRIPTION OF THE PREFERRED EMBODIMENTS

Figure 1:
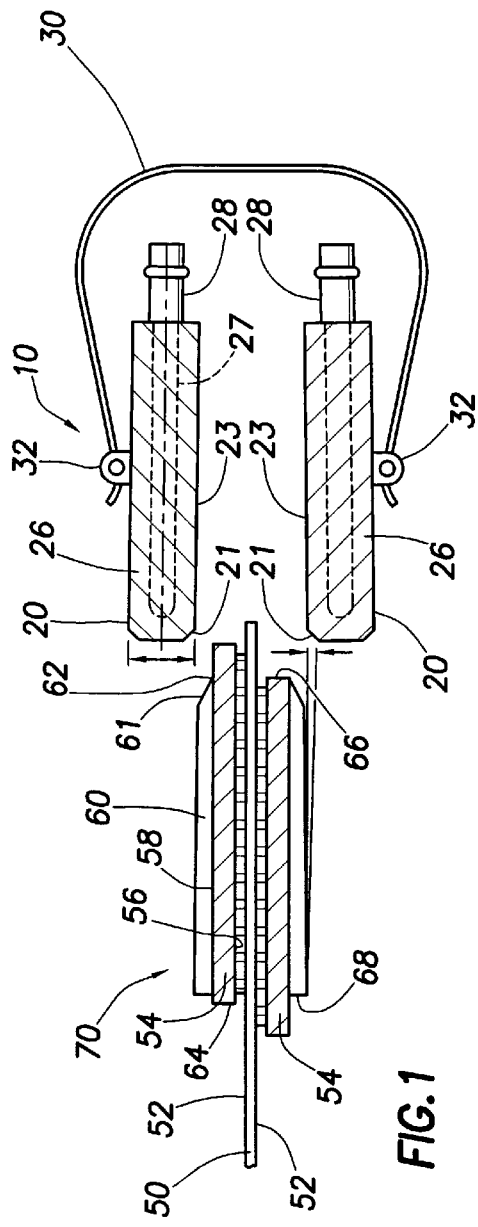
FIG. 1 is a schematic top view of a beat dissipation system constructed in accordance with a preferred embodiment of the present invention, shown in its decoupled state.
Figure 2:
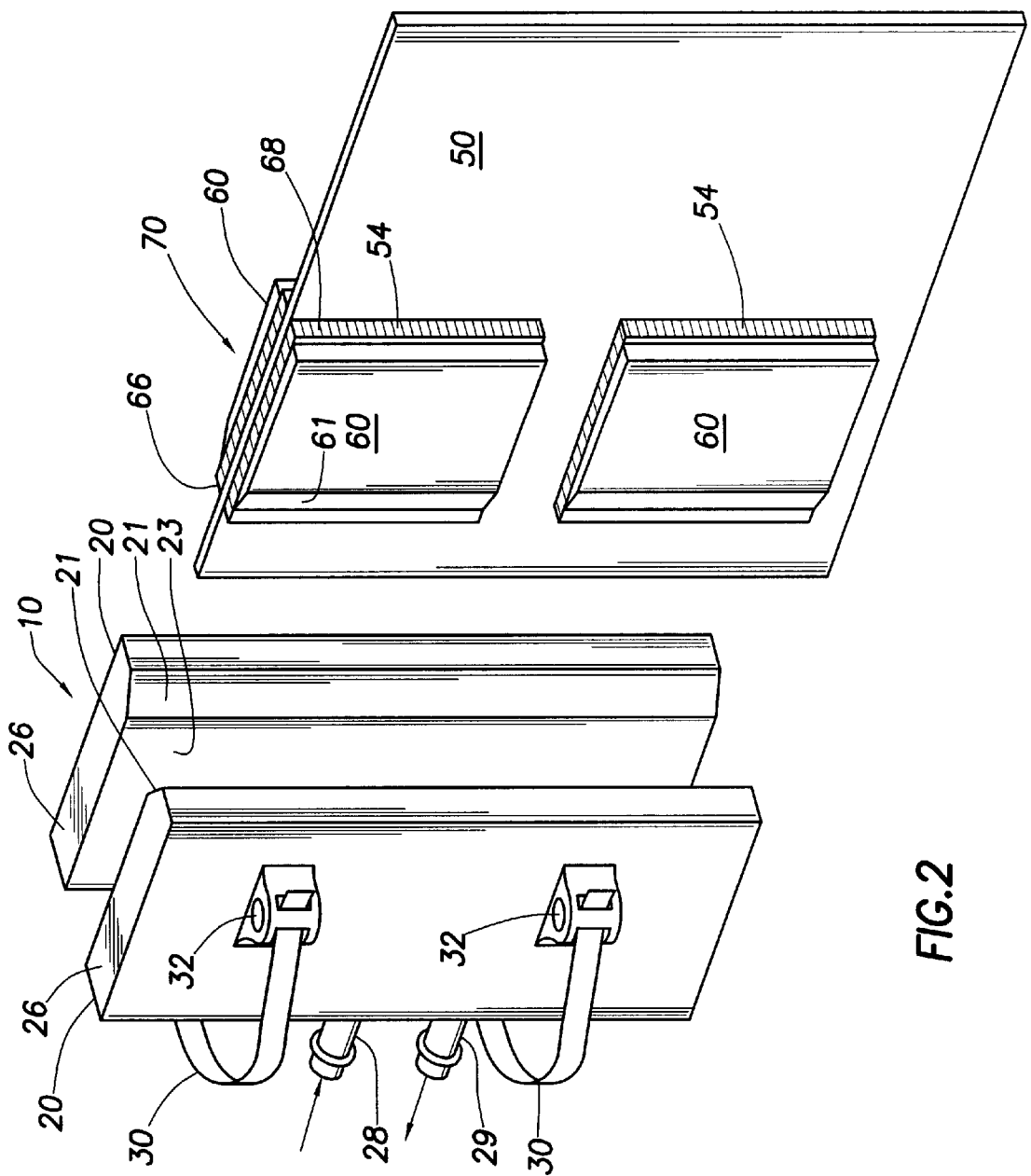
FIG. 2 is a perspective view of the heat dissipation system of FIG. 1.

Referring initially to FIGS. 1 and 2, a first embodiment of the present heat dissipation apparatus comprises a heat absorbing member 10 and a wedge-shaped body 70. Heat absorbing member 10 comprises a pair of liquid cooled cold plates 20, which are connected together and held in a loosely parallel, spaced, opposing relationship by at least one flexible spring member 30. Spring member 30 can be a metal piece, such as a metal strip, or any other suitably springy material. Each cold plate 20 preferably comprises a thermally conductive body 26 through which a fluid conduit 27 passes. As is known in the art, fluid conduit 27 (shown in phantom) is preferably U-shaped and is connected at one end to a fluid inlet line 28, and at its other end to a fluid outlet line 29. Cold plates 20 are preferably connected by means inlet 28 and outlet 29 to flexible coolant lines (not shown), which in turn may be connected to a conventional refrigeration system, which may include, for example, components such as motors, heat exchanger and pressure relief chamber, together with an expansion device.

Body 26 of each cold plate 20 is preferably constructed of a highly thermally conductive material, such as aluminum or the like. Cold plates 20 preferably are configured as substantially rectangular prisms, and are arranged with their largest aspects 23 loosely parallel to one another. If desired, a small chamfer 21 can be provided along one or more of the long corners of each body 26, particularly along the corner facing the opposite cold plate.

Cold plates 20 are each preferably connected to their respective end of spring(s) 30 by a pivotable mount 32. Mount 32 can be any suitable pivotable mounting device, but preferably allows each cold plate 20 to pivot about at least its vertical (as drawn) longitudinal axis.

Still referring to FIGS. 1 and 2, a printed circuit board (PCB) 50 has heat generating electric components 54 mounted on both of its opposed faces 52 in a conventional manner. In a preferred embodiment of the invention, each heat generating electric component 54 has an electrical contact face 56, which faces the PCB 50, and a heat transfer face 58, which is outward. Each heat transfer face 58 supports a thermally conducting interposer 60. Each interposer 60 has a uniform aspect along its height, but tapers from a first, lesser thickness at one long edge 62 to a second, greater thickness at its opposite long edge 64. As shown in FIG. 1, interposers 60 are preferably mounted such that their thinner edges 62 are oriented the same way with respect to PCB 50 and define an inner end 66. Likewise, thicker edges 64 are oriented the same way with respect to PCB 50 and define an outer end 68. In this manner, the tapered interposers 60, in combination with heat generating electric components 54, and PCB 50 form wedge-shaped body 70. If desired, a chamfer 61 can be provided along one or more of the long corners of each interposer 60, particularly along the corner facing the opposite interposer. It is preferred that the interface between each interposer 60 and its respective heat generating electric component be a highly thermally conductive interface, so as to maximize the heat dissipating capability of the system.

Figure 3:
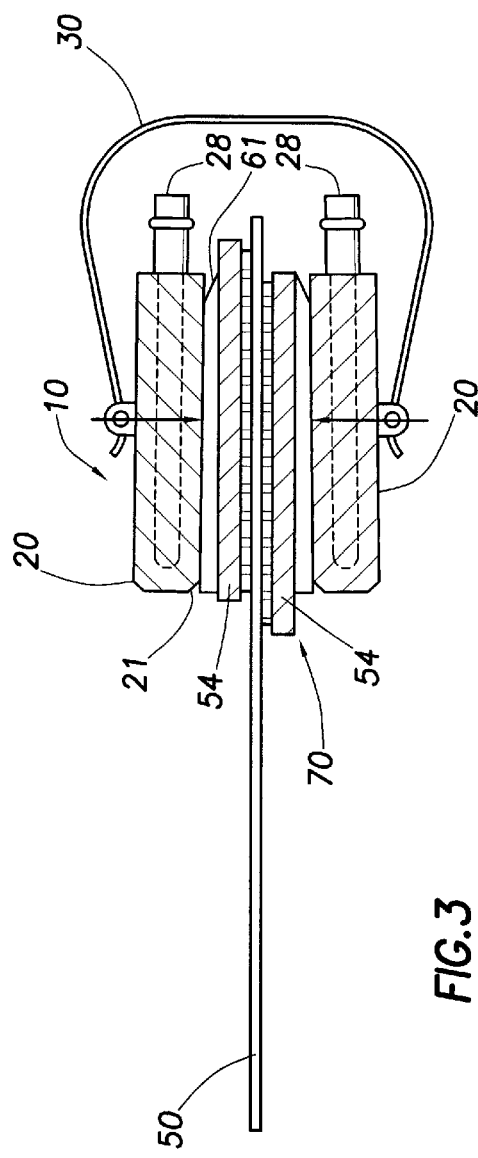
FIG. 3 is a schematic top view of the heat dissipation system of FIG. 1, shown in its coupled state.

Referring now to FIG. 3, heat absorbing member 10 is shown in thermal contact with wedge-shaped body 70. Specifically, when it is desired to place cold plates 20 in contact with heat generating electric components 54, heat absorbing member 10 is advanced over the edge of PCB 50 until interposers 60 fully engage cold plates 20.

It is preferred to construct spring 30 such that it supports cold plates 20 such that the distance between their opposed faces 23 when interposers 60 are disengaged is somewhat less than the thickness of the outer end 68 of body 70. In this manner, it is ensured that spring 30 will be loaded when the interposers 60 are fully engaged and will urge cold plates 20 toward interposers 60 with sufficient force to ensure good thermal conductivity. If the deformation caused by the engagement of interposers 60 alone is insufficient to cause spring 30 to apply a sufficient load, spring 30 can be pre-loaded. If spring 30 is pre-loaded, it will bias cold plates 20 together even when interposers 60 are disengaged. If pre-loading is desired, it is preferred to include a releasable stop (not shown) between cold plates 20, so that cold plates 20 are prevented from completely coming together when interposers 60 are disengaged. The combination of pre-loading with the use of a stop makes it possible to maintain cold plates 20 farther apart, such that the distance between them is greater than the thickness of inner end 66, although it must still be less than the thickness at out end 68 so that the load is transferred from the stop to the interposer. This in turn makes it relatively easy to initiate insertion of wedge 70. Similarly, chamfers 21, 62, if provided, assist in the initial insertion by aligning the inner end 66 between cold plates 20. The pivotable mounting of cold plates 20 ensures that cold plates 20 align with the outer surfaces of interposers 60.

It is preferred to include at least one releasable latch (not shown), such as a locking tab, for maintaining heat absorbing member 10 in contact with wedge-shaped body 70.

Figure 4:
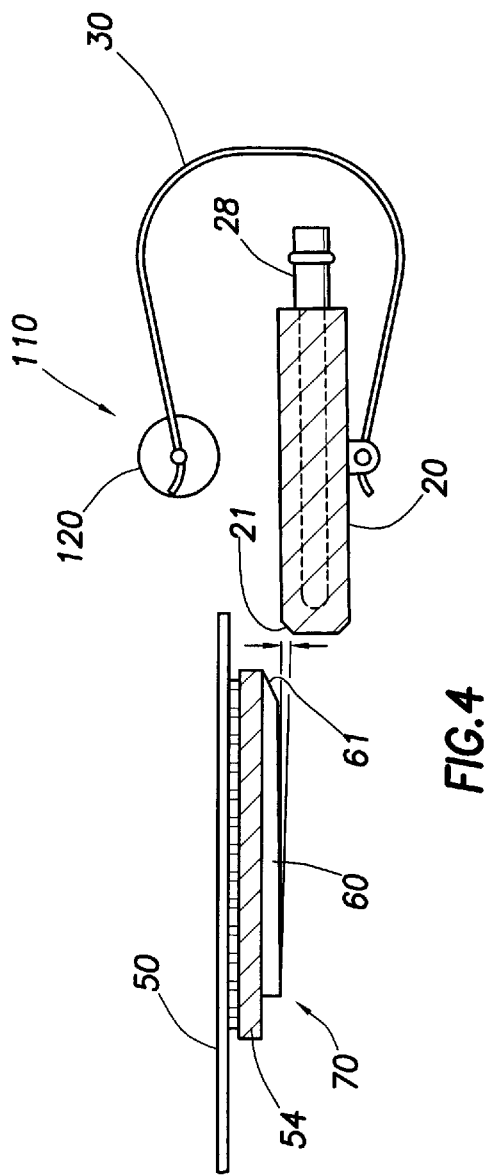
FIG. 4 is a schematic top view of a heat dissipation system constructed in accordance with a first alternative embodiment of the present invention, shown in its decoupled state.
Figure 5:
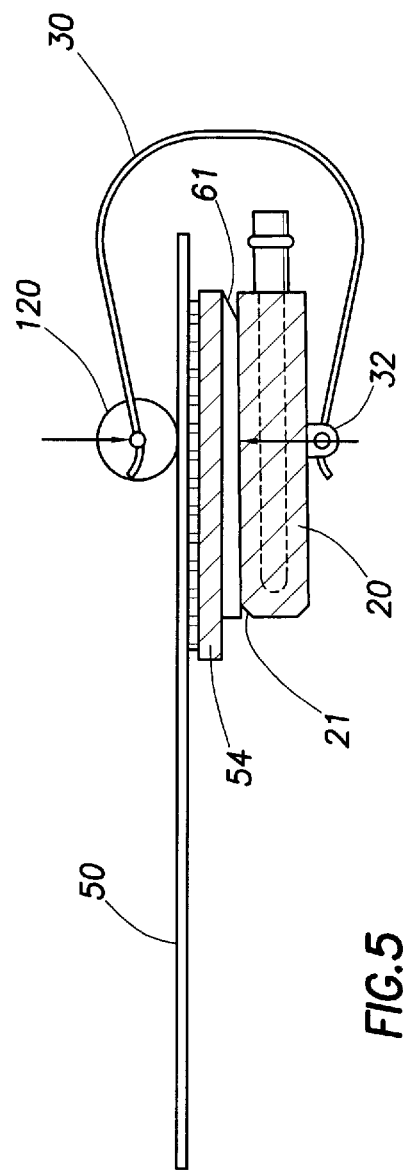
FIG. 5 is a schematic top view of the heat dissipation system of FIG. 4, shown in its coupled state.

Referring now to FIGS. 4 and 5, an alternative embodiment of the present heat dissipating system includes a heat absorbing member 110 and a wedge-shaped body 70. Heat absorbing member 110 includes a single cold plate 20 affixed to one end of a spring 30, with the other end of the spring 30 preferably supporting a non-conductive roller 120. Roller 120 is preferably mounted so that it rotates around an axis that is out of the plane of the paper as drawn. As discussed above, spring 30 biases cold plate 20 and roller 120 together to ensure good thermal contact between cold plate 20 and interposer 60. Whereas in the embodiment shown in FIGS. 1–3 each cold plate 20 acts as a bracing member for the other cold plate, in the embodiment shown in FIGS. 4 and 5 roller 120 acts as a bracing member for cold plate 20.

Figure 6:
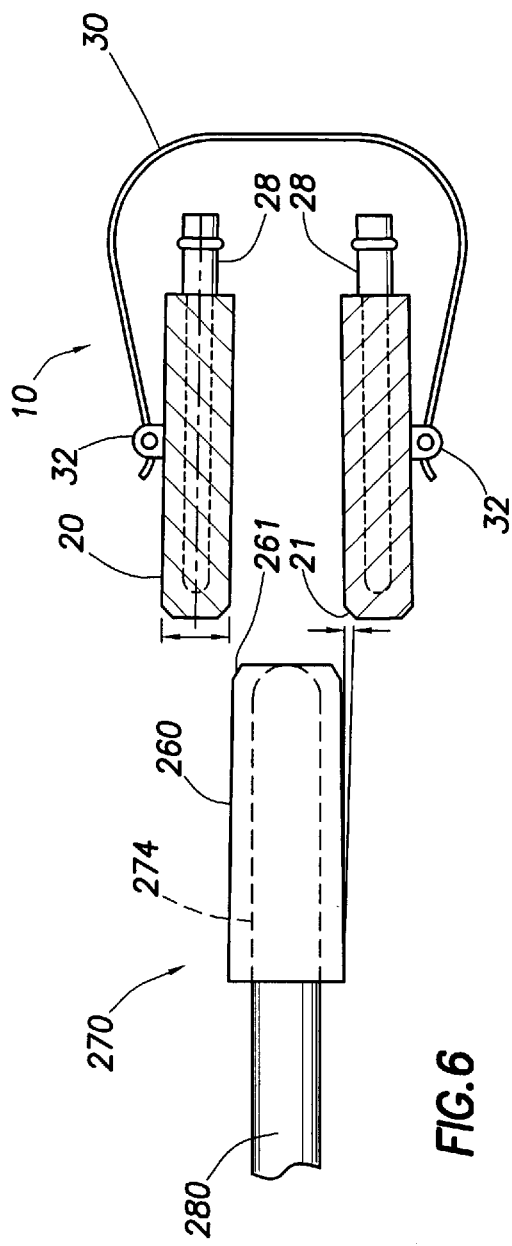
FIG. 6 is a schematic top view of a heat dissipation system constructed in accordance with an alternative embodiment of the present invention, shown in its decoupled state.
Figure 8:
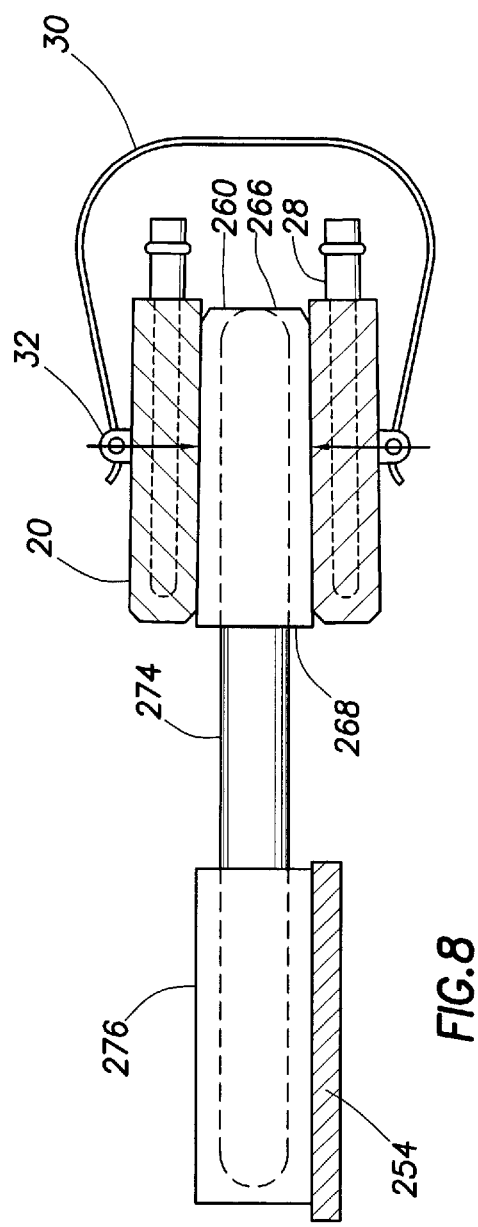
FIG. 8 is a schematic top view of the heat dissipation system of FIG. 6, shown in its coupled state.
Figure 7:
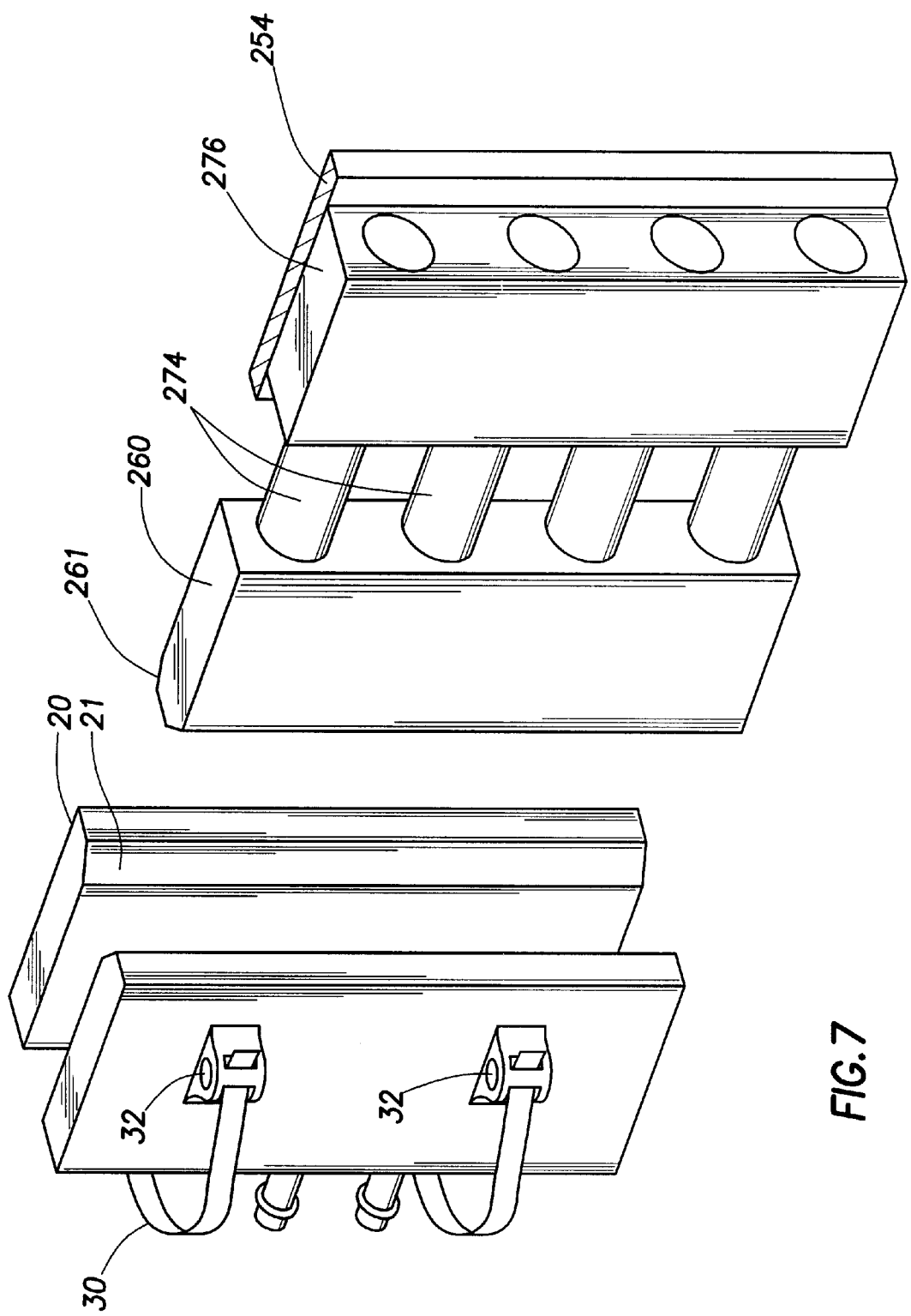
FIG. 7 is a perspective view of the heat dissipation system of FIG. 7.

Referring now to FIGS. 6–8, a second alternative embodiment includes a spring-loaded heat absorbing member 10 as described above, in combination with a wedge-shaped body 270 that is thermally coupled to a heat sink 280. More particularly, wedge-shaped body 270 includes tapered interposer 260 mounted on a thermal conductor 274. In one preferred embodiment, thermal conductor 274 comprises a vapor phase heat pipe. Alternatively, conductor 274 can comprise a length of thermally conducting material, such as aluminum, or a liquid phase heat pipe. Conductor 274 extends between interposer 260 and a heat sink device 276 (FIG. 8), which in turn contacts a heat generating electric component 254. The inclusion of conductor 274 makes it possible to use the more effective fluid cooling on heat generating electric components that are difficult to access, without forfeiting the easy connection and disconnection of the fluid cooling system. As above chamfers 21 and 261 can be provided to facilitate engagement of the interposer(s) with the cooling plates.

It is important to note that in each embodiment of the invention, the movement of the cold plate(s) 20 into and out of contact with the heat generating electric components can be achieved easily and quickly without the use of any tools whatsoever, and without the need to disconnect the fluid lines from the cold plates.

While preferred embodiments of the invention have been disclosed and described, it will be understood that various modifications can be made to the apparatus described herein without departing from the scope of the invention. For example, it is not necessary to use a single spring to bias the cold plates together. Instead, each plate can be provided with its own separate spring, with both springs being mounted on a support device. Similarly, the interposers do not have to be tapered along their entire lengths, so long as they form a body that is wider at one point than the resting distance between the cold plates, so that the compression load of the spring pre-loaded or otherwise) can be transferred to the interposer so as to facilitate heat transfer.

What is claimed is:

1. A heat dissipating apparatus for use on a heat generating electric component, comprising:
    a heat-transmitting interposer mounted on the heat generating electric component; and
    a heat absorbing member including:
        a heat absorber,
        a bracing member, and
        a spring biasing said heat absorber toward said bracing member;
    said heat absorbing member being moveable between a first position in which said interposer is compressed between said heat absorber and said bracing member and a second position in which said interposer is not compressed between said heat absorber and said bracing member.

2. The heat dissipating apparatus of claim 1 wherein said bracing member comprises a second heat absorber.

3. The heat dissipating apparatus of claim 1 wherein the distance between said heat absorber and said bracing member is less in said second position than the same distance in said first position.

4. The heat dissipating apparatus of claim 1 wherein said interposer is tapered.

5. The heat dissipating apparatus of claim 1 wherein said spring is pre-loaded.

6. The heat dissipating apparatus of claim 1 wherein said heat absorber comprises a cold plate.

7. A heat dissipating apparatus for use on a heat generating electric component, comprising:
   an interposer mounted on the heat generating electric component; and
   a heat absorbing member including:
   first and second heat absorbers, and
   a spring biasing said heat absorbers together;
   said heat absorbing member being moveable between a first position in which said interposer is compressed between said heat absorbers and a second position in which said interposer is not compressed between said heat absorbers.

8. The heat dissipating apparatus of claim 7 wherein the distance between said heat absorbers is less in said second position than the same distance in said first position.

9. The heat dissipating apparatus of claim 7 wherein said interposer is tapered.

10. The heat dissipating apparatus of claim 7 wherein said spring is pre-loaded.

11. The heat dissipating apparatus of claim 7 wherein each heat absorber comprises a cold plate.

12. A method for removing heat from a heat generating component inside a computer, comprising:
   (a) providing an interposer mounted on the heat generating electric component;
   (b) providing a heat absorbing member including a heat absorber, a bracing member, and a spring biasing said heat absorber toward said bracing member;
   (c) moving said heat absorbing member between a first position in which said interposer is compressed between said heat absorber and said bracing member and a second position in which said interposer is not compressed between said heat absorber and said bracing member.

13. The method according to claim 12 wherein the bracing member comprises a second heat absorber.

14. The method according to claim 12 wherein the distance between the heat absorber and the bracing member is less in said second position than the same distance in said first position.

15. The method according to claim 12 wherein the interposer is tapered.

16. The method according to claim 12 wherein the spring is pre-loaded.

17. The method according to claim 12 wherein the heat absorber comprises a cold plate.

* * * * *